United States Patent
Braat

(10) Patent No.: US 6,396,067 B1
(45) Date of Patent: May 28, 2002

(54) MIRROR PROJECTION SYSTEM FOR A SCANNING LITHOGRAPHIC PROJECTION APPARATUS, AND LITHOGRAPHIC APPARATUS COMPRISING SUCH A SYSTEM

(75) Inventor: Josephus J. M. Braat, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/170,466

(22) Filed: Oct. 13, 1998

(30) Foreign Application Priority Data

May 6, 1998 (EP) .............................. 98201483

(51) Int. Cl.[7] .............................. A61N 5/00; G21G 5/00
(52) U.S. Cl. .................................................. 250/492.2
(58) Field of Search .................. 250/492.2; 359/355, 359/208, 858, 351, 857

(56) References Cited

U.S. PATENT DOCUMENTS 5,686,728 A * 11/1997 Shafer ..................... 250/492.2
5,805,365 A * 9/1998 Sweatt ........................ 359/858
5,815,310 A * 9/1998 Williamson .................. 359/365
5,844,666 A * 12/1998 Van Engelen ................. 355/72
5,973,826 A * 10/1999 Chapman ..................... 359/355
6,014,252 A * 1/2000 Shafer ........................ 359/355
6,033,079 A * 3/2000 Hudyma ...................... 359/857
6,072,852 A * 6/2000 Hudyma ...................... 378/34
6,118,577 A * 9/2000 Sweatt et al. ................ 359/351

FOREIGN PATENT DOCUMENTS

EP        0779528 A2    6/1997

* cited by examiner

Primary Examiner—Jack Berman
Assistant Examiner—Johnnie L Smith, II
(74) Attorney, Agent, or Firm—Aaron Waxler

(57) ABSTRACT

A mirror projection system for use in a step-and-scan lithographic projection apparatus, in which a mask pattern is repetitively scan-imaged on a number of areas of a substrate by means of a beam of EUV radiation having a cross-section shaped as a segment of a ring. The system has six imaging mirrors arranged such that no intermediate image is formed and the system has a negative magnification. When this projection system is used in a scanning apparatus, the mask and the substrate move in opposite directions during scanning, which is advantageous from a mechanical point of view.

6 Claims, 3 Drawing Sheets

MIRROR PROJECTION SYSTEM FOR A SCANNING LITHOGRAPHIC PROJECTION APPARATUS, AND LITHOGRAPHIC APPARATUS COMPRISING SUCH A SYSTEM

BACKGROUND OF THE INVENTION

This invention relates to a mirror projection system for use in a step-and-scan lithographic projection apparatus for imaging a mask pattern, present in a mask, on a substrate by means of a beam of EUV radiation. The beam has a circular segment-shaped cross-section. The projection system is constituted by six imaging mirrors having ordinal numbers 1–6 from the object side to the image side, the second, the third and the sixth mirrors being concave and the fifth mirror being convex.

The invention also relates to a lithographic apparatus for step-and-scan imaging of a mask pattern on a number of areas of a substrate, which apparatus comprises such a mirror projection system.

EP-A 0 779 528 describes a mirror projection system for use in a step-and-scan lithographic apparatus with which an integrated circuit, IC, mask pattern is imaged on a number of areas of a semiconductor substrate, using EUV radiation. EUV, extreme ultraviolet, radiation is understood to mean radiation having a wavelength in the range between several nm and several tens of nm. This radiation is also referred to as soft X-ray radiation. The use of EUV radiation provides the great advantage that extremely small details, of the order of 0.1 $\mu$m or less, can be imaged satisfactorily. In other words, an imaging system in which EUV radiation is used has a very high resolving power without the numerical operator, NA, of the system having to be extremely large, so that also the depth of focus of the system still has a reasonably large value. Since no suitable material is available to make lenses for EUV radiation, a mirror projection system must be used for imaging the mask pattern on the substrate, instead of a hitherto conventional lens projection system.

The lithographic apparatuses currently used in the production of ICs are stepping apparatuses. In these apparatuses, a full field illumination is used, i.e. all areas of the mask pattern are illuminated simultaneously and these areas are simultaneously imaged on one IC area of the substrate. After a first IC area has been illuminated, a step is made to a subsequent IC area, i.e. the substrate holder is moved in such a way that the next IC area will be positioned under the mask pattern, whereafter this area is illuminated, and so forth until all IC areas of the substrate of the mask pattern are illuminated. As is known, it remains desirable to have ICs with an increasing number of components.

It is attempted to meet this desire not only by reducing the dimensions of these components but also by enlarging the surface areas of the ICs. This means that the, already relatively highly NA of the projection lens system must be further increased and, for a stepping apparatus, the image field of this system must also be further increased. This is practically impossible.

It has therefore been proposed to change from a stepping apparatus to a step-and-scan apparatus. In such an apparatus, a rectangular or circular segment-shaped sub-area of the mask pattern and hence also such a sub-area of an IC area of the substrate is illuminated, and the mask pattern and the substrate are moved synchronously through the illumination beam, taking the magnification of the projection system into account. A subsequent circular segment-shaped sub-area of the mask pattern is then imaged each time on a corresponding sub-area of the relevant IC area on the substrate. After the entire mask pattern has been imaged on an IC area in this way, the substrate holder performs a stepping movement, i.e. the beginning of a subsequent IC area is introduced into the projection beam and the mask is set to its initial position, whereafter said subsequent IC area is scan-illuminated via the mask pattern. This scan-imaging method may be used to great advantage also in a lithographic apparatus in which EUV radiation is used as projection radiation.

The embodiment of the projection system described in EP 0 779 528, intended for use with EUV radiation having a wavelength of 13 nm has, an NA of 0.20 at the image side. The annular image field has an inner radius of 29 mm and an outer radius of 31 mm and a length of 30 mm. The resolution of the system is 30 nm and the aberrations and distortions are sufficiently small to form a good image of a transmission mask pattern on an IC area of a substrate by way of a scanning process. The first and the fourth mirror of this projection system are concave. A first pair of mirrors, consisting of the first and the second mirror, constitutes a magnified image of the object or the mask pattern. This image is transported by a second pair of mirrors, constituted by the third and the fourth mirror, and presented to a third pair of mirrors, constituted by the fifth and the sixth mirror, which provides the desired telecentric image with the required aperture NA=0.20. In this projection system, an intermediate image is formed between the third and the fourth mirror, and the total projection system has a positive magnification.

When such a mirror system is used in a step-and-scan lithographic projection apparatus, a positive magnification means that the mask and the substrate must move in the same direction during scanning. Since both the mask and the substrate are accommodated in a relatively heavy holder, which in its turn forms part of an even heavier displacement table, two heavy masses must be moved in the same direction during scanning, so that stability problems may arise. However, since position accuracies of the order of nm are required in said lithographic apparatus, this apparatus must be extremely stable.

SUMMARY OF THE INVENTION

It is an object of the present invention to provide a novel concept for a projection system of the type described in the opening paragraph, with which, inter alia, the above-mentioned problem can be solved. To this end, the projection system is characterized in that the first and the fourth mirror are convex.

In the novel projection system, the formation of an intermediate image is deliberately avoided so that the magnification is negative. When using this system in a step-and-scan apparatus, the mask and the substrate move in opposite directions during scanning. This projection system comprises a first group, constituted by the first and the second mirror, having a collimator function, and a second group, constituted by the third, the fourth, the fifth and the sixth mirror, providing the ultimate image. A further advantage of the projection system is that it is reasonably insensitive to tilts of the mirrors because mainly parts of the mirror sections located proximate to the optical axis are used.

It is to be noted that U.S. Pat. No. 5,686,728 describes a six-mirror projection system for a step-and-scan apparatus. However, this projection system is designed for wavelengths in the range between 100 nm and 300 nm, i.e. not for EUV radiation. Moreover, the mirrors, viewed from the mask to the substrate, are consecutively convex, concave, convex, concave, convex and concave, and the system has a positive magnification.

Within the above-mentioned design concept of the novel projection system, there is still some freedom of choice of the parameters NA, magnification and size of the image field.

A first embodiment of the projection system is characterized in that one of the mirrors is spherical and the other mirrors are aspherical, and in that the system has a numerical aperture of the order of 0.13 to 0.15 at the image side, a magnification M=−0.25 and a circular segment-shaped image field having a width of 1 mm.

This projection system is suitable for imaging details having a size of the order of 70 nm.

An aspherical surface is understood to mean a surface whose fundamental shape is spherical but whose actual surface locally deviates from this fundamental shape so as to correct aberrations of the system.

However, the projection system is preferably further characterized in that all mirrors are aspherical, and in that the system has a numerical aperture of the order of 0.20 at the image side, a magnification M=−0.25 and a circular segment-shaped image field having a width of 2 mm.

By making all mirrors aspherical, the system can be corrected for a wider image field and the numerical aperture can be increased. Details having a size of the order of 50 nm can be imaged with this system.

The projection system is preferably further characterized in that it is telecentric at the image side.

Consequently, no magnification errors can occur upon undesired displacements of the substrate along the optical axis.

The projection system may be further characterized in that the edge of the fifth mirror provides a boundary for the beam, which boundary substantially has the shape of a circular segment and functions as a diaphragm.

The projection system may be used for imaging both a transmissive mask pattern and a reflective mask pattern. For EUV radiation, a reflective mask pattern can be manufactured more easily than a transmissive mask pattern.

The invention also relates to a lithographic apparatus for step-and-scan imaging of a mask pattern, present in a mask, on a number of areas of a substrate, which apparatus comprises an illumination unit with a source for EUV radiation, a mask holder for accommodating a mask, a substrate holder for accommodating a substrate, and a projection system. This apparatus is characterized in that the projection system is a mirror projection system as described above.

These and other aspects of the invention will be apparent from and will be elucidated with reference to the embodiments described hereinafter.

DESCRIPTION OF THE PREFERRED EMBODIMENTS

Figure 1:
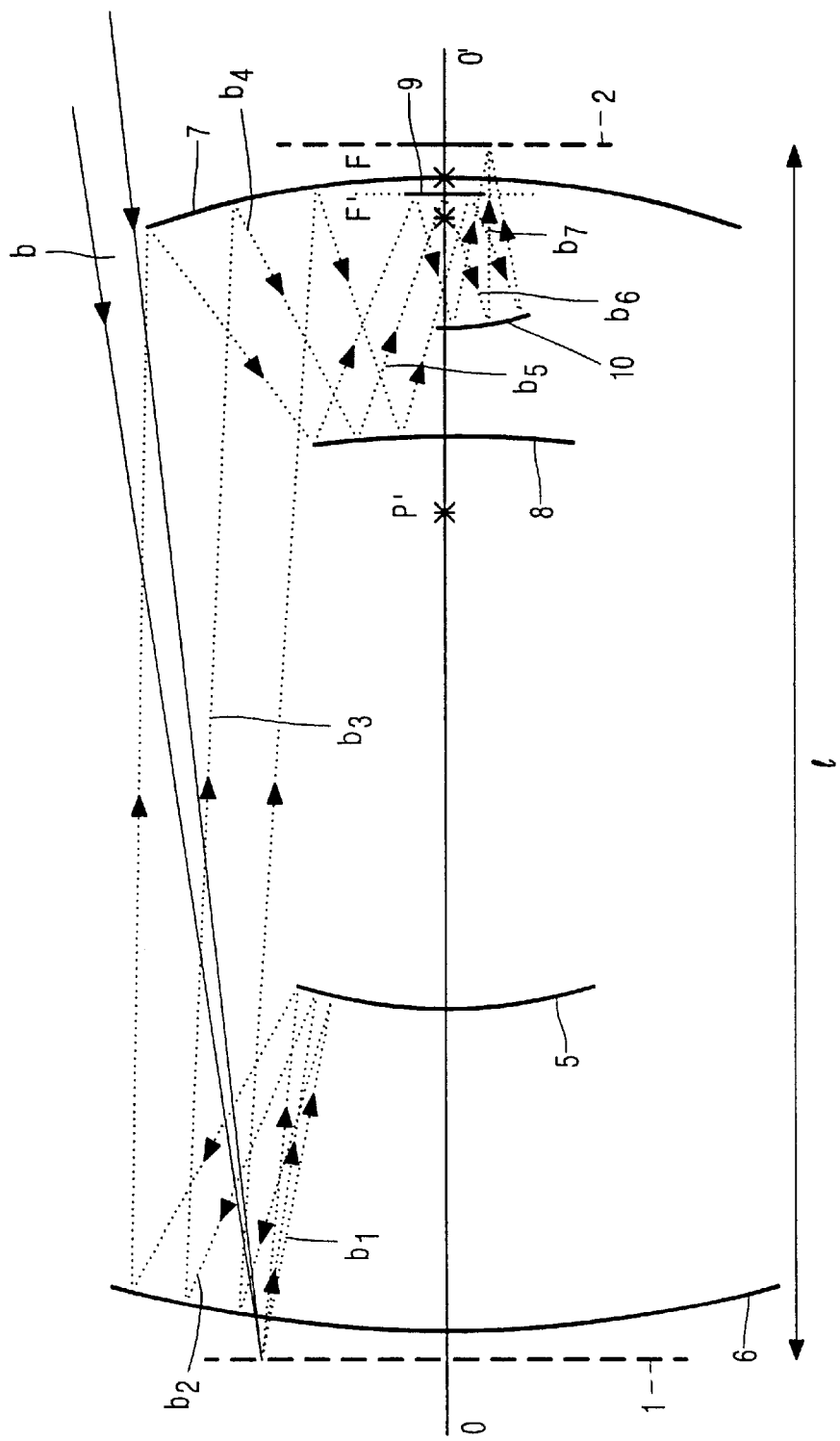
FIG. 1 shows a first embodiment of the projection system according to the invention.

In FIG. 1, the object plane, in which the mask to be imaged can be arranged, is denoted by the reference numeral 1, and the image plane, in which the substrate can be arranged, is denoted by the reference numeral 2. The object plane is illuminated with a beam b emitted by a radiation source (not shown). If the mask is a reflective mask, the radiation source is situated at the same side of the mask as the mirror projection system. The beam $b_1$ then reflected by the mask is incident on the first mirror 5 of the system, which mirror is convex. This mirror reflects the beam as a diverging beam $b_2$ to the second mirror 6 which is concave. The mirror 6 reflects the beam as a substantially parallel beam $b_3$ to the third mirror 7. Mirror 7 is a concave mirror and reflects the beam as a converging beam $b_4$ to the fourth mirror 8. This mirror is convex and reflects the beam as a less strongly converging beam $b_5$ to the fifth mirror 9 which is convex and reflects the beam as a diverging beam $b_6$ to the sixth mirror 10. This mirror is concave and focuses the beam as beam $b_7$ in the image plane 2. The mirrors 5 and 6 jointly constitute a collimator section of the system, and the mirrors 7, 8, 9 and 10 constitute an objective section which forms the desired telecentric image on the substrate.

The convex mirror 9 is situated at such a position and has such a size that the beam $b_7$ just passes along this mirror. A boundary which, in principle, is circular segment-shaped, is constituted by the edge of the mirror 9, which boundary functions as a part of a diaphragm. The second part of this diaphragm may be constituted by a beam-limiting element which is arranged below the mirror 9 and at the same axial position as the mirror. As is known, a diaphragm prevents scattered radiation or radiation caused by unwanted reflections from reaching the image-forming beam in an imaging system, which could degrade the contrast of the image formed in the plane 2. Moreover, the diaphragm fixes the numerical aperture and the cross-section of the imaging beam and thus ensures a constant power of illumination.

Furthermore, all mirror surfaces of the system shown in FIG. 1 are aspherical. The system is thereby satisfactorily corrected for the desired aperture.

The system is coaxial, which means that the centers of curvature of all mirrors are located on one axis, the optical axis OO'. From the point of view of assembly and tolerances, this is very advantageous.

The following Table I shows the values of the relevant parameters of the embodiment of FIG. 1. These parameters are:

the distances measured along the optical axis OO':
$d_1$: between the object plane 1 and the mirror 5;
$d_2$: between the mirror 5 and the mirror 6;
$d_3$: between the mirror 6 and the mirror 7;
$d_4$: between the mirror 7 and the mirror 8;
$d_5$: between the mirror 8 and the mirror 9;
$d_6$: between the mirror 9 and the mirror 10;
$d_7$: between the mirror 10 and the image plane 2,
the radii of curvature measured along the optical axis:
$R_1$: of the mirror 5;
$R_2$: of the mirror 6;
$R_3$: of the mirror 7;
$R_4$: of the mirror 8;
$R_5$: of the mirror 9,
$R_6$: of the mirror 10,
the even terms $a_2$, $a_4$, $a_6$, $a_8$ and $a_{10}$ of the known series development:

$$Z = \sum_{i=1}^{5} a_{2i} \cdot r^{2i}$$

describing the shape of an aspherical surface.

TABLE I $d_1$ = 280.0000 mm.
$d_2$ = −260.0000
$d_3$ = 960.0000
$d_4$ = −216.0000
$d_5$ = 202.0000
$d_6$ = −112.1610
$d_7$ = 153.1980
$R_1$ = 377.9229 mm.
$R_2$ = 925.7226
$R_3$ = −796.2104
$R_4$ = −922.7632
$R_5$ = 324.9499
$R_6$ = 226.9066

|  | mirror 1 | mirror 2 | mirror 3 |
|---|---|---|---|
| $a_2$ | .13230210E-02 | .54011628E-03 | −.62797471E-03 |
| $a_4$ | −.10645945E-08 | −.68172785E-10 | −.16785609E-09 |
| $a_6$ | .44372794E-13 | .70014948E-16 | −.36815828E-15 |
| $a_8$ | −.18801920E-17 | −.26279346E-20 | −.10783023E-20 |
| $a_{10}$ | .30929350E-22 | .70427507E-26 | .27139638E-26 |

|  | mirror 4 | mirror 5 | mirror 6 |
|---|---|---|---|
| $a_2$ | −.54185078E-03 | .15386989E-02 | .22035498E-02 |
| $a_4$ | −.43745658E-09 | .18072296E-07 | .14287653E-07 |
| $a_6$ | −.17867006E-13 | .53959702E-12 | .19896638E-12 |
| $a_8$ | .53390786E-19 | −.79986727E-17 | .32581411E-17 |
| $a_{10}$ | .41019870E-24 | .48606201E-19 | .10540137E-21 |

The system has a magnification M of −0.25, a numerical aperture NA of 0.20 and the circular segment of the image at the area of the image plane 2 has an inner radius of 35.5 mm and an outer radius of 37.5 mm, so that this plane is scanned with a circular segment-shaped spot having a width of 2 mm. The length, or cord, of this spot is of the order of 30 mm. The total length 1 of the system in FIG. 1, is approximately 1009 mm. The system is intended for forming an image by means of radiation having a wavelength of 13 nm, and to this end, the mirrors are provided in known manner with a multilayer structure which reflects radiation of this wavelength as satisfactorily as possible. Examples of multilayer structures for this purpose are described in, inter alia, U.S. Pat. No. 5,153,898.

Figure 2:
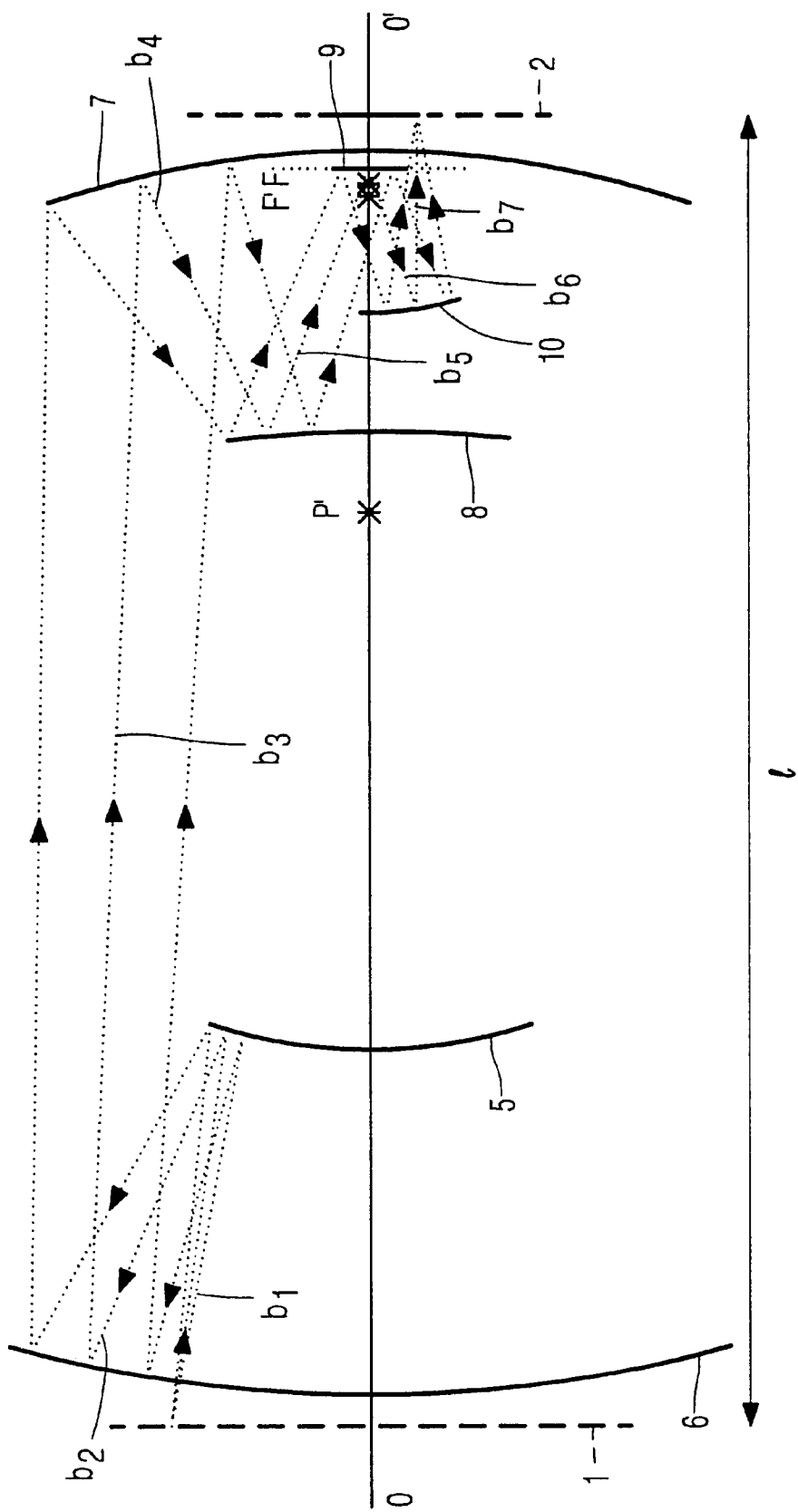
FIG. 2 shows a second embodiment of the projection system.

FIG. 2 shows an embodiment of the mirror projection system in which the second mirror, the concave mirror 6, is spherical and the other mirrors are aspherical. A correct image can be formed with this image, though for a smaller numerical aperture. Moreover, the image field has a smaller width than the image field of the system shown in FIG. 1. In the embodiment of FIG. 2, the used part of the mirror 7 is located closer to the optical axis than in the embodiment shown in FIG. 1, so that the system shown in FIG. 2 is more stable.

Table II shows the values of the relevant parameters of the projection system of FIG. 2, using the same notation as for the projection system of FIG. 1.

TABLE II $d_1$ = 280.0000 mm.
$d_2$ = −260.0000
$d_3$ = 960.0000

TABLE II-continued $d_4$ = −216.0000
$d_5$ = 202.0000
$d_6$ = −112.2079
$d_7$ = 153.2210
$R_5$ = 356.6445 mm.
$R_6$ = 848.2375
$R_7$ = −1042.8599
$R_8$ = −5215.9238
$R_9$ = 285.9565
$R_{10}$ = 227.0027

|  | mirror 5 | mirror 7 | mirror 8 |
|---|---|---|---|
| $a_2$ | .14019564E-02 | −.47945082E-03 | −.95860295E-04 |
| $a_4$ | .39452317E-08 | .14479592E-09 | .20476657E-09 |
| $a_6$ | −.24393487E-13 | −.14421364E-15 | −.14395181E-13 |
| $a_8$ | .24452743E-17 | −.90327415E-21 | .13397470E-18 |
| $a_{10}$ | −.34732754E-22 | .74859463E-26 | −.71120834E-24 |

|  | mirror 9 | mirror 10 |
|---|---|---|
| $a_2$ | .17485174E-02 | .22026171E-02 |
| $a_4$ | .15671501E-07 | .13622569E-07 |
| $a_6$ | .19215336E-12 | .16550839E-12 |
| $a_8$ | .96274494E-15 | .52723915E-17 |
| $a_{10}$ | −.14423111E-17 | −.11827144E-21 |

This system also has a magnification M of −0.25. The numerical aperture NA is now 0.14 at the image side and the circular segment-shaped image field has an inner radius of 36 mm and an outer radius of 37 mm, hence a width of 1 mm. The distance 1 between the object plane 1 and the image plane 2 is approximately 1037 mm.

Figure 3:
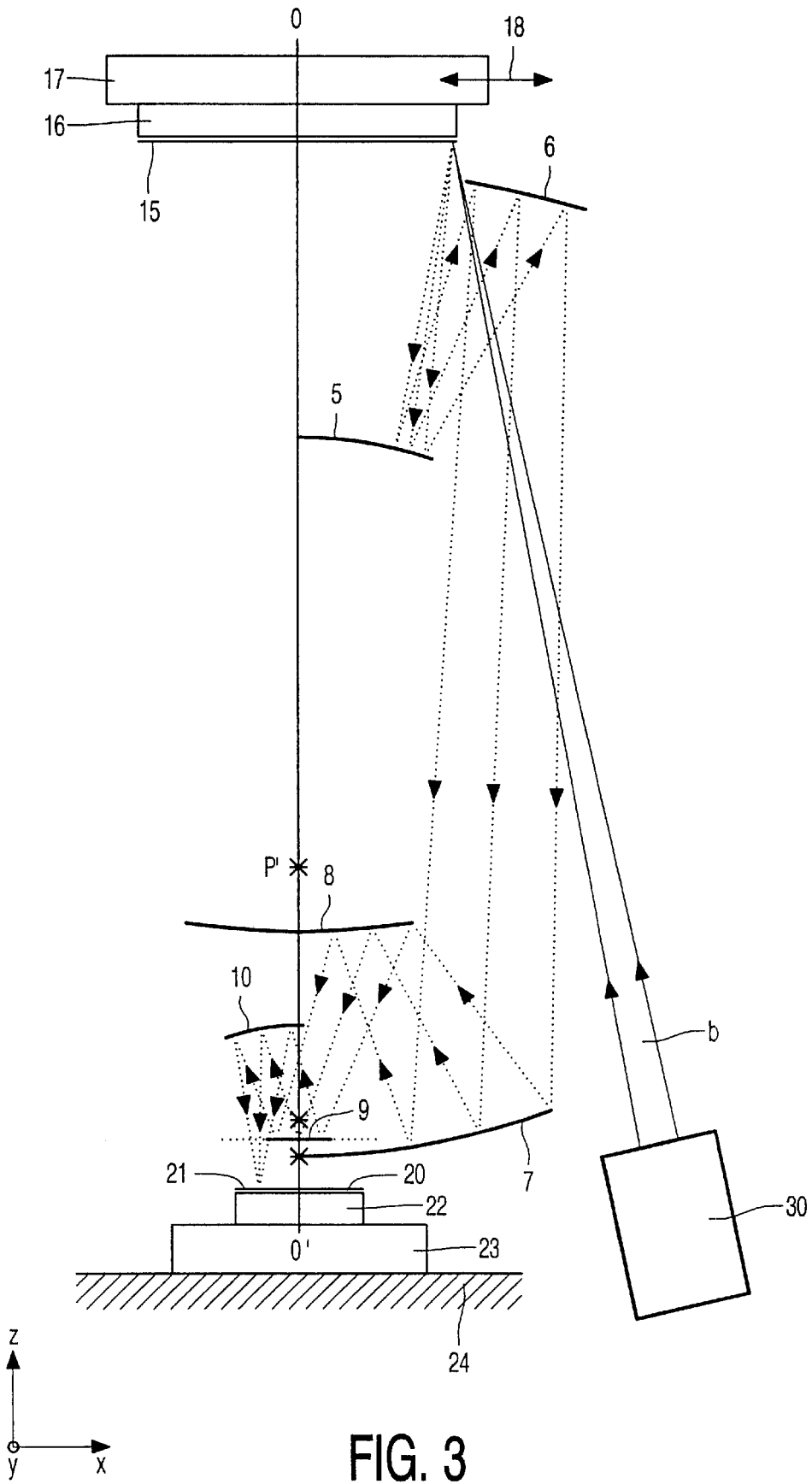
FIG. 3 shows diagrammatically an embodiment of a lithographic apparatus comprising such a projection system.

FIG. 3 shows very diagrammatically an embodiment of a step-and-scan lithographic apparatus which comprises a mirror projection system according to the invention for imaging a mask pattern, present in a reflective mask 15, on a substrate 20 which is provided with a layer 21 sensitive to EUV radiation. The apparatus comprises an illumination unit 30 which is shown diagrammatically, accommodating an EUV radiation source and an optical system for forming an illumination beam b whose cross-section has the shape of a circular segment. For the sake of clarity, some space has been left in the Figure between the illumination beam b and the substrate table 23 and the imaging section 7, 8, 9, 10 of the mirror projection system. Actually, however, the beam b may enter the projection column closely along these elements. The reflective mask to be imaged is arranged under a mask holder 16 which forms part of a mask table 17, with which the mask can be moved in the scanning direction 18, and possibly in a direction perpendicular to the scanning direction, such that all areas of the mask pattern can be positioned under the illumination spot formed by the illumination beam b. The mask holder and mask table are shown very diagrammatically and may be implemented in various ways. The substrate 20 is arranged on a substrate holder 22 which is supported by a substrate table (stage) 23. This table can move the substrate in the scanning direction (X direction) but also in the Y direction perpendicular thereto. During scanning, the substrate and the mask move in opposite directions. The substrate table is supported by a support 24.

Moreover, the substrate can be moved in the Z direction, the direction of the optical axis OO', and rotated about the Z axis. In sophisticated apparatuses, the substrate can also be tilted about the X axis and the Y axis. For further details of a step-and-scan apparatus, reference is made by way of example to PCT patent application WO 97/33204, which corresponds to U.S. patent application Ser. No. 08/810798, filed Mar. 4, 1997.

The projection system is telecentric at the side of the substrate, which has the advantage that no magnification errors occur upon possible unwanted movements in the Z direction of the substrate with respect to the projection system.

Furthermore, the optical free working distance, i.e. the free working distance as determined by the projection system and apart from possible mechanical provisions, is of the order of 40 mm.

The mirror projection system may not only be used for imaging a reflective mask pattern, as described above, but also for imaging a transmissive mask pattern. Instead of being situated below the mask, as shown in FIG. 3, the illumination unit is then situated above the mask. However, it is simpler to manufacture a reflective mask for EUV radiation than a transmissive mask for this radiation.

The EUV lithographic projection apparatus may be used in the manufacture of ICs but also, for example, liquid crystalline display panels, integrated or planar optical systems, magnetic heads and guidance and detection patterns for magnetic domain memories.

What is claimed is:

1. A lithographic apparatus for step-and-scan imaging of a mask pattern, present in a mask, on a number of areas of a substrate, by means of a beam of EUV radiation, which apparatus comprises an illumination unit with a source of EUV radiation, a mask holder for accommodating a mask, a substrate holder for accommodating a substrate, and a mirror projection system comprising; six imaging mirrors having ordinal numbers 1–6 from the object side to the image side, the second, the third and the sixth mirror being concave and the fifth mirror being convex, characterized in that the first and the fourth mirror are convex wherein one of the six mirrors is spherical and the other five mirrors are aspherical.

2. A lithographic apparatus for step-and-scan imaging of a mask pattern, present in a mask, on a number of areas of a substrate, by means of a beam of EUV radiation, which apparatus comprises an illumination unit with a source of EUV radiation, a mask holder for accommodating a mask, a substrate holder for accommodating a substrate, and a mirror projection system comprising; six imaging mirrors having ordinal numbers 1–6 from the object side to the image side, the second, the third and the sixth mirror being concave and the fifth mirror being convex, characterized in that the first and the fourth mirror are convex wherein the six imaging mirrors are arranged so that no intermediate image is formed and the mirror projection system has a negative magnification.

3. An optical system for use in a projection lithographic apparatus where a pattern on a lithographic mask is projected onto a substrate by means of a beam of EUV radiation, said optical system comprising:

starting from the mask side and proceeding to the substrate side of the system, the EUV radiation beam traverses six reflecting surfaces in the following order, a first convex reflecting surface, a second concave reflecting surface, a third concave reflecting surface, a fourth convex reflecting surface, a fifth convex reflecting surface, and a sixth concave reflecting surface wherein the six reflecting surfaces are arranged so that no intermediate image is formed and the optical system has a negative magnification.

4. An optical system for use in a projection lithographic apparatus where a pattern on a lithographic mask is projected onto a substrate by means of a beam of EUV radiation, said optical system comprising:

starting from the mask side and proceeding to the substrate side of the system, the EUV radiation beam traverses six reflecting surfaces in the following order, a first convex reflecting surface, a second concave reflecting surface, a third concave reflecting surface, a fourth convex reflecting surface, a fifth convex reflecting surface, and a sixth concave reflecting surface wherein said six reflecting surfaces are coaxially disposed along a common optical axis of the optical system.

5. An optical system:for use in a projection lithographic apparatus where a pattern on a lithographic mask is projected onto a substrate by means of a beam of EUV radiation, said optical system comprising:

starting from the mask side and proceeding to the substrate side of the system, the EUV radiation beam traverses six reflecting surfaces in the following order, a first convex reflecting surface, a second concave reflecting surface, a third concave reflecting surface, a fourth convex reflecting surface, a fifth convex reflecting surface, and a sixth concave reflecting surface wherein the EUV radiation beam has a wavelength of approximately 13 nm.

6. An optical system for use in a projection lithographic apparatus where a pattern on a lithographic mask is projected onto a substrate by means of a beam of EUV radiation, said optical system comprising:

starting from the mask side and proceeding to the substrate side of the system, the EUV radiation beam traverses six reflecting surfaces in the following order, a first convex reflecting surface, a second concave reflecting surface, a third concave reflecting surface, a fourth convex reflecting surface, a fifth convex reflecting surface and a sixth concave reflecting surface wherein the optical system consist of one of the reflecting surfaces being spherical and the other five reflecting surfaces are aspherical, and the said spherical reflecting surface is the second reflecting surface.

\* \* \* \* \*